US012626754B2

(12) United States Patent
Takahashi et al.

(10) Patent No.: US 12,626,754 B2
(45) Date of Patent: May 12, 2026

(54) SEMICONDUCTOR DEVICE HAVING PAD ELECTRODE EQUIPPED WITH LOW PASS FILTER CIRCUIT

(71) Applicant: Micron Technology, Inc., Boise, ID (US)

(72) Inventors: Nobuki Takahashi, Sagamihara (JP); Kohei Nakamura, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 18/635,854

(22) Filed: Apr. 15, 2024

(65) Prior Publication Data

US 2024/0386942 A1 Nov. 21, 2024

Related U.S. Application Data

(60) Provisional application No. 63/502,989, filed on May 18, 2023.

(51) Int. Cl.
*G11C 11/4093* (2006.01)
*H03H 11/04* (2006.01)

(52) U.S. Cl.
CPC ..... *G11C 11/4093* (2013.01); *H03H 11/0405* (2013.01)

(58) Field of Classification Search
CPC ........................ G11C 11/4093; H03H 11/0405
See application file for complete search history.

(56) References Cited

U.S. PATENT DOCUMENTS

| | | | | |
|---|---|---|---|---|
| 6,718,522 | B1 * | 4/2004 | McBride | G06F 30/33 |
| | | | | 716/106 |
| 2002/0036576 | A1 * | 3/2002 | Saito | H03K 17/693 |
| | | | | 341/122 |
| 2019/0229734 | A1 * | 7/2019 | Hecht | H01L 23/5252 |
| 2024/0267041 | A1 * | 8/2024 | Latchamanan | H03K 17/063 |

* cited by examiner

*Primary Examiner* — Min Huang
(74) *Attorney, Agent, or Firm* — Dorsey & Whitney LLP

(57) ABSTRACT

An example apparatus includes a passgate circuit between first and second nodes, the passgate circuit having a plurality of transistors at least two of which are operatively connected in parallel in a first mode and operatively connected in series in a second mode. The plurality of transistors may include first and second transistors coupled in parallel between the first and second nodes and controlled in common by a first control signal activated in the first mode. The plurality of transistors may further include third and fourth transistors connected in series between the first and second nodes and controlled in common by a second control signal activated in the second mode.

18 Claims, 10 Drawing Sheets

SEMICONDUCTOR DEVICE HAVING PAD ELECTRODE EQUIPPED WITH LOW PASS FILTER CIRCUIT

CROSS-REFERENCE TO RELATED APPLICATION(S)

This application claims priority to U.S. Provisional Application No. 63/502,989, filed May 18, 2023. The aforementioned application is incorporated herein by reference, in its entirety, for any purpose.

BACKGROUND

A semiconductor device such as a DRAM (Dynamic Random Access Memory) may have a high-speed operation mode and a low-speed operation mode. Since frequencies of signals input to a semiconductor device from outside are different in a high-speed operation mode and a low-speed operation mode, if the semiconductor device is designed such that circuit characteristics of an input circuit are optimized for a high-speed operation mode, the signal quality of signals input to the semiconductor device may be degraded in a low-speed operation mode.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
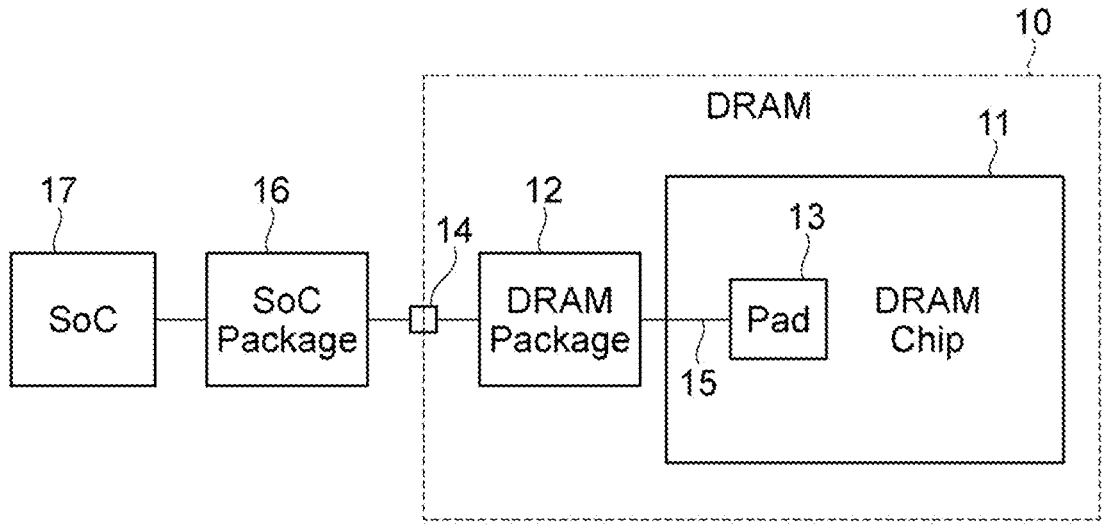
FIG. 1 is a block diagram explaining a configuration of a semiconductor device according to an embodiment of the present disclosure.

FIG. 1 is a block diagram explaining a configuration of a semiconductor device according to an embodiment of the present disclosure. As shown in FIG. 1, a semiconductor device 10 according to the present embodiment is a DRAM. The semiconductor device 10 is constituted of a DRAM chip 11 including an internal pad electrode 13 and a DRAM package 12 including an external pad electrode 14. The internal pad electrode 13 and the external pad electrode 14 are connected to each other via the DRAM package 12. The DRAM package 12 and the internal pad electrode 13 are positioned on the topmost wiring layer of the DRAM chip 11 and are connected to each other via an iRDL (inline redistribution layer) 15 formed on a wiring layer on which the internal pad electrode 13 is provided. The external pad electrode 14 is connected to an SoC (system-on-chip) 17 via an SoC package 16. Signals output from the SoC 17 are supplied to the internal pad electrode 13 on the DRAM chip 11 via the external pad electrode 14 and the iRDL 15.

Figure 2:
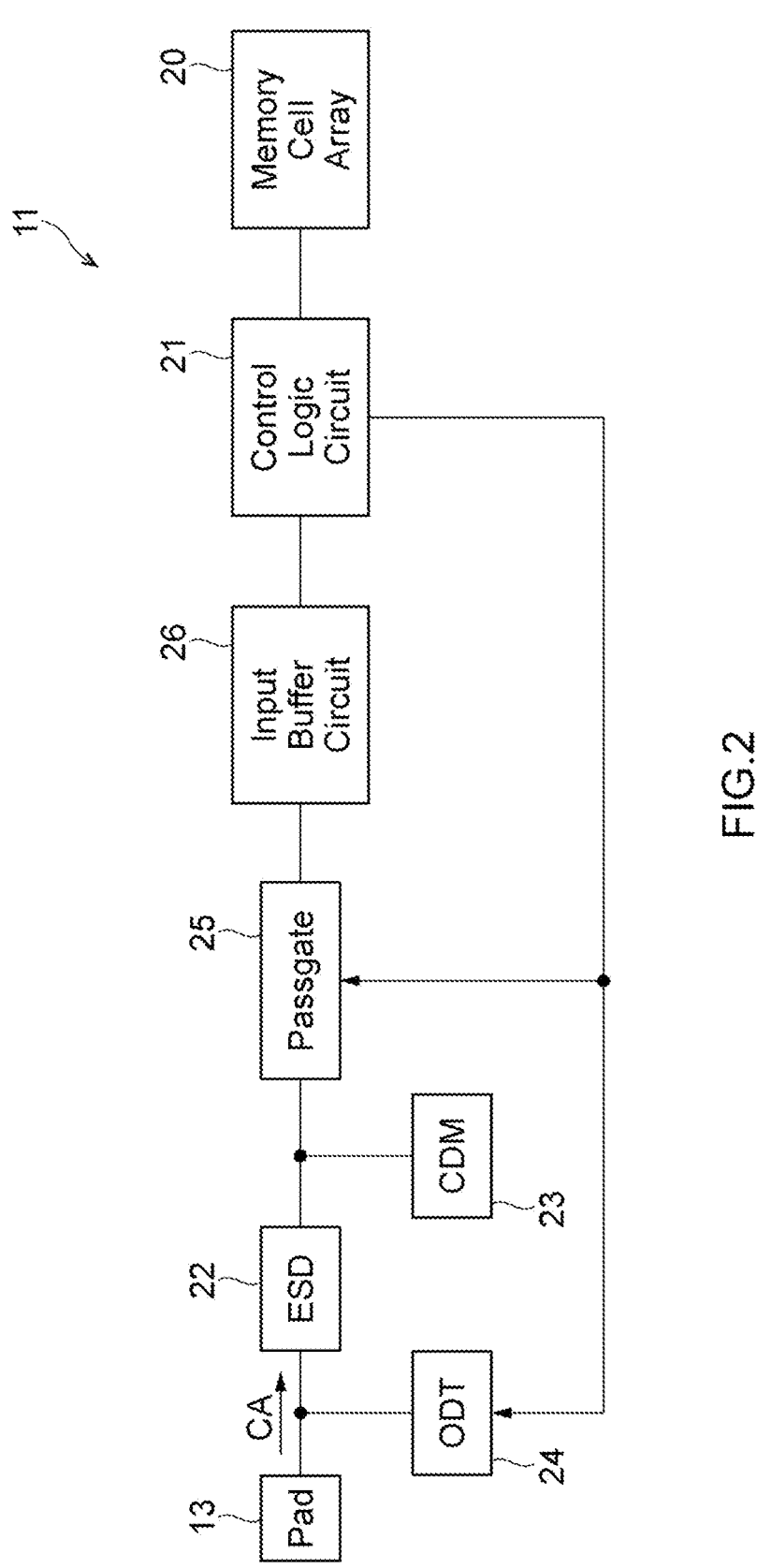
FIG. 2 is a block diagram explaining an internal configuration of a DRAM chip.

FIG. 2 is a block diagram explaining an internal configuration of the DRAM chip 11. As shown in FIG. 2, the DRAM chip 11 includes a memory cell array 20 having a plurality of DRAM cells and a control logic circuit 21 that controls the memory cell array 20. A command/address signal CA is supplied to the control logic circuit 21 from outside via the internal pad electrode 13. An ESD protection circuit 22, a CDM protection circuit 23, and an ODT circuit 24 are connected to the internal pad electrode 13. The command/address signal CA input to the internal pad electrode 13 is supplied to the control logic circuit 21 via a passgate circuit 25 and an input buffer circuit 26. Circuit characteristics of the ODT circuit 24 and the passgate circuit 25 are controlled by the control logic circuit 21. For example, when the semiconductor device 10 is set in a high-speed operation mode, by activating the ODT circuit 24, the internal pad electrode 13 is caused to function as a terminating resistor. Meanwhile, when the semiconductor device 10 is set in a low-speed operation mode, by deactivating the ODT circuit 24, the consumption current of the semiconductor device 10 is reduced.

Figure 3:
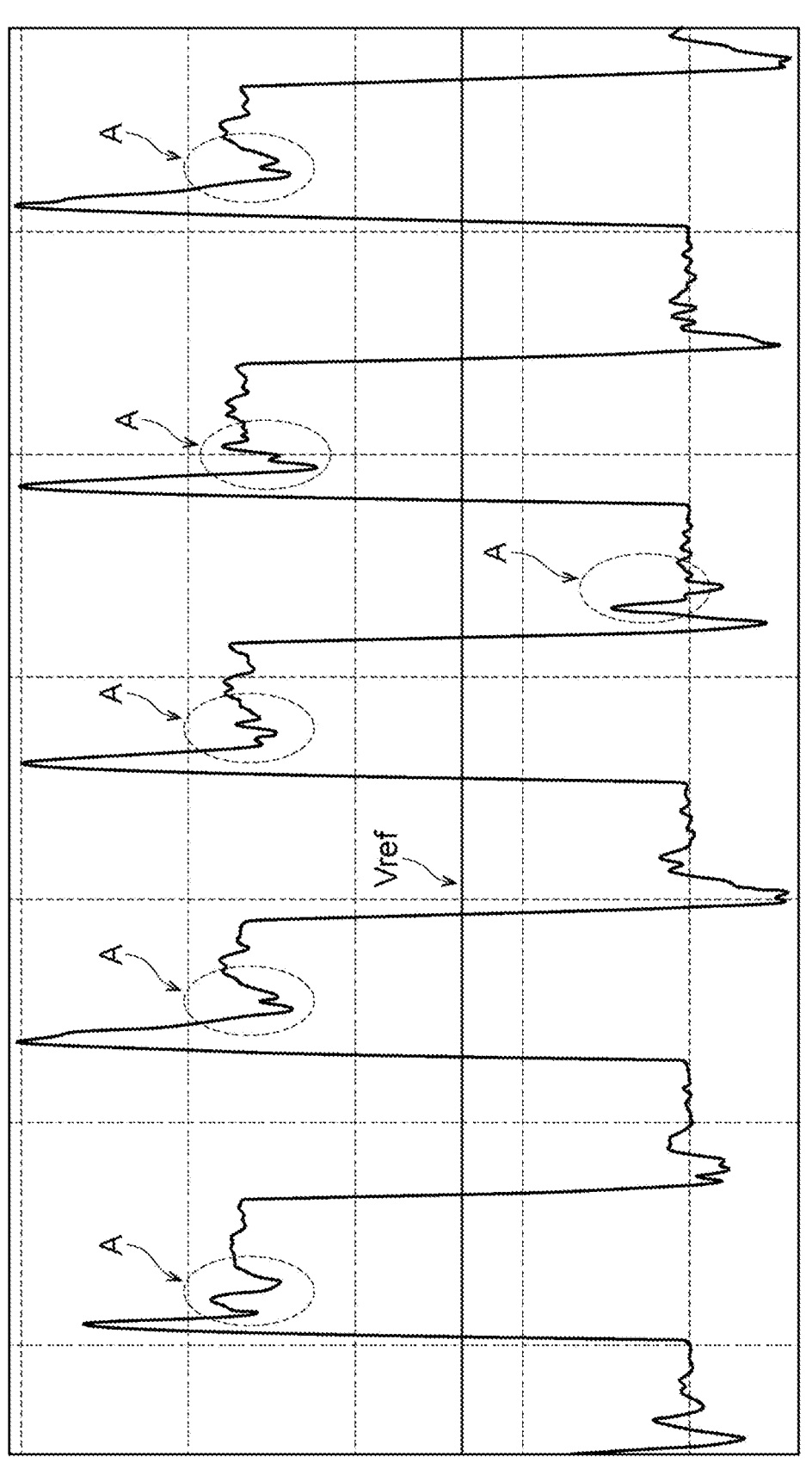
FIG. 3 is an example of signal waveforms of a command/address signal on an internal pad electrode.

FIG. 3 is an example of signal waveforms of the command/address signal CA on the internal pad electrode 13 when the ODT circuit 24 is deactivated. As shown in FIG. 3, the command/address signal CA has a predetermined amplitude around a reference level Vref. However, when the ODT circuit 24 is deactivated, since the command/address signal CA input to the internal pad electrode 13 is reflected, ring-back indicated with the sign A may occur right after the command/address signal CA changes from a low level to a high level or right after the command/address signal CA changes from a high level to a low level. When such ring-back occurs, a data eye is reduced.

Figure 4:
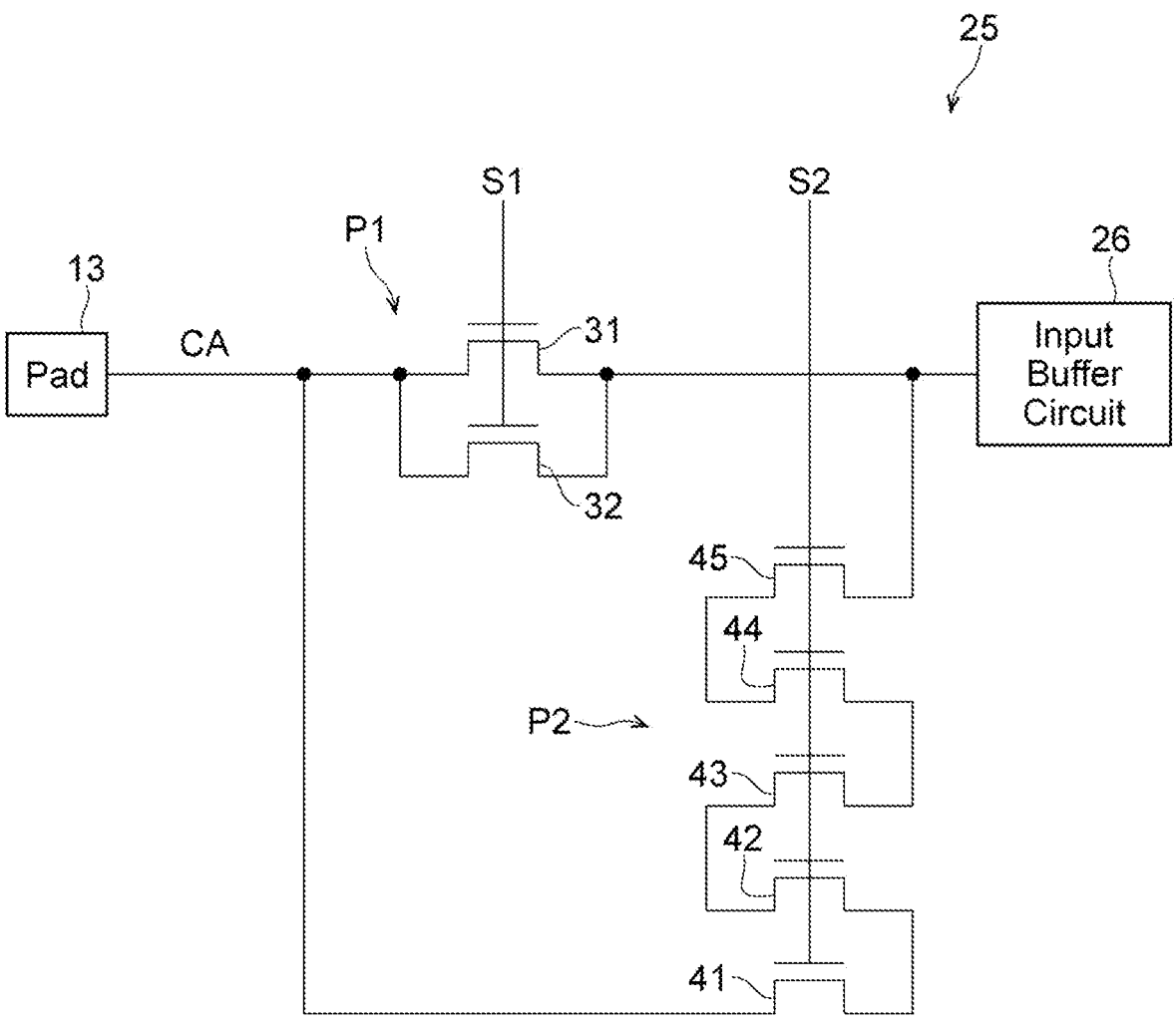
FIG. 4 is a circuit diagram of a passgate circuit.

FIG. 4 is a circuit diagram of the passgate circuit 25. In the example shown in FIG. 4, the passgate circuit 25 includes two signal paths P1 and P2 connected to each other in parallel. The signal path P1 is formed of two transistors 31 and 32 connected to each other in parallel. The signal path P2 is formed of five transistors 41 to 45 connected to one anther in series. With this configuration, the signal paths P1 and P2 are different in resistance value from each other, and the signal path P2 has a higher resistance value than the signal path P1. The sizes of the transistors 31, 32, and 41 to 45 may be mutually the same. A control signal S1 is commonly supplied from the control logic circuit 21 to gate electrodes of the transistors 31 and 32. A control signal S2 is commonly supplied from the control logic circuit 21 to gate electrodes of the transistors 41 to 45.

Figure 5A:
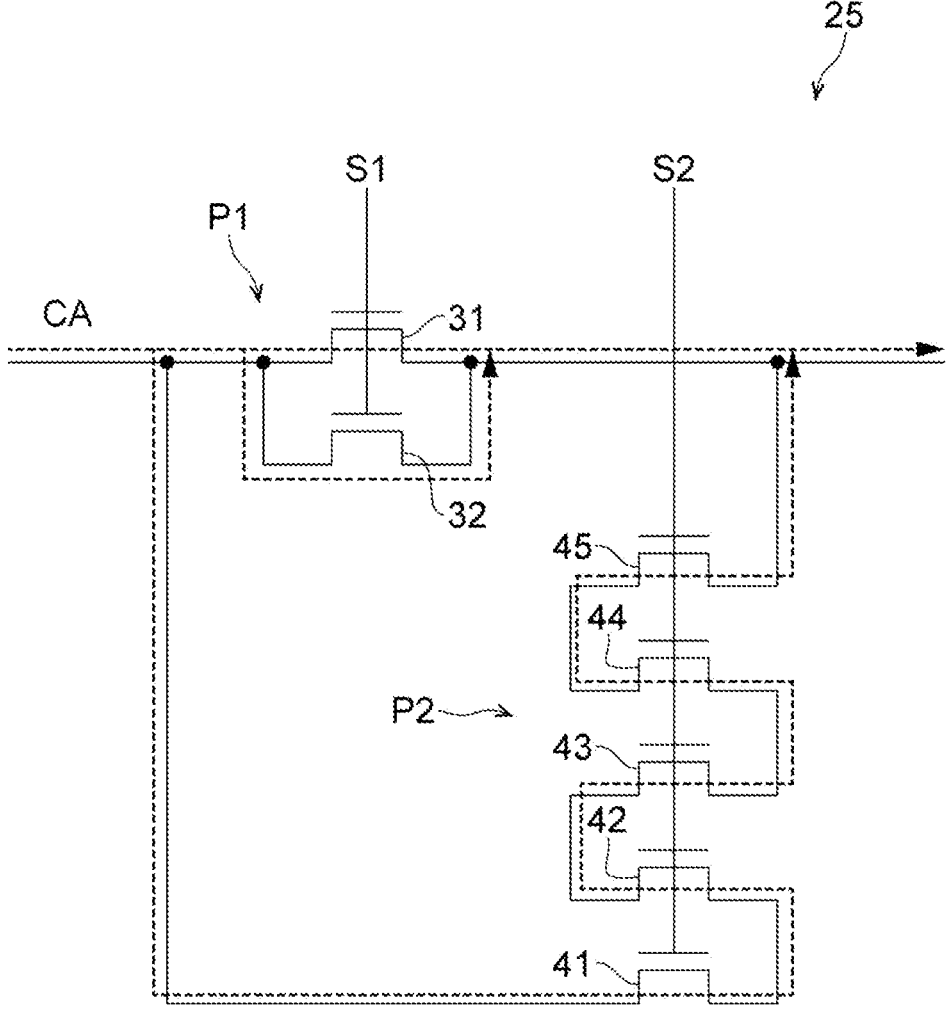
FIGS. 5A to 5C are explanatory diagrams of an operation mode of the passgate circuit.
Figure 5B:
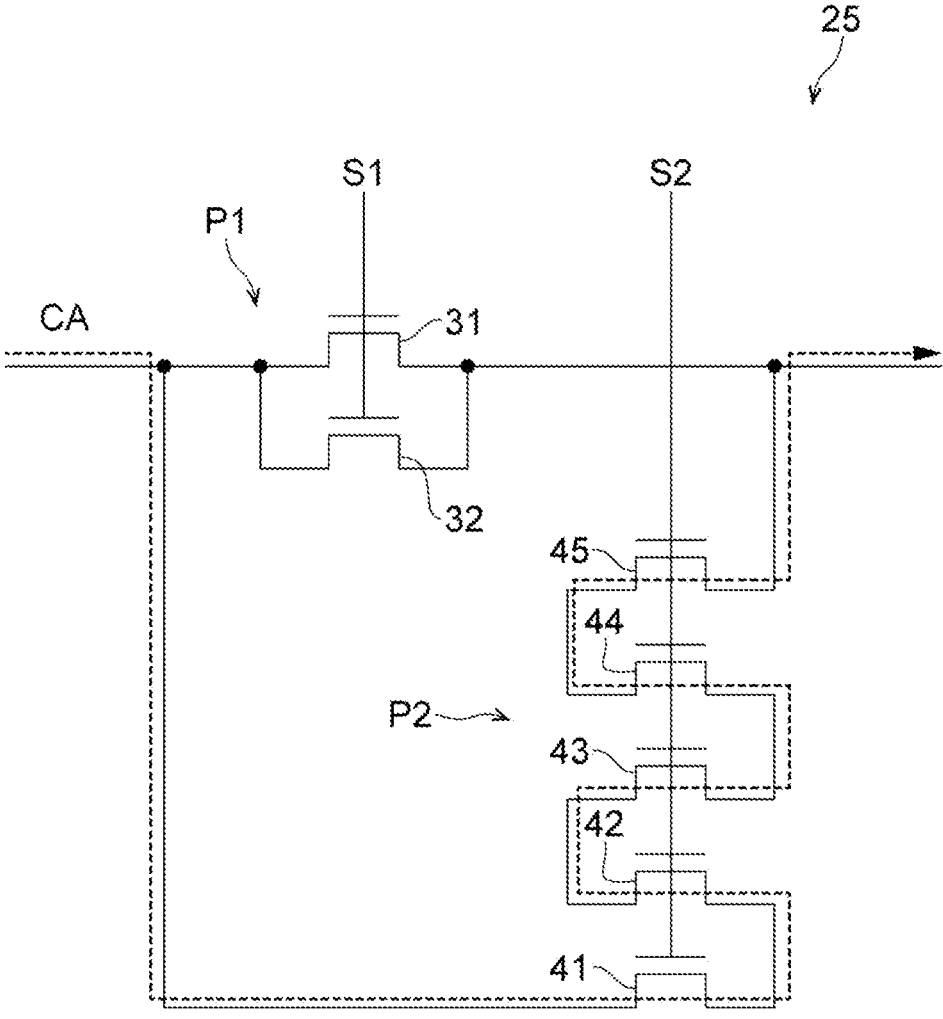
Figure 5C:
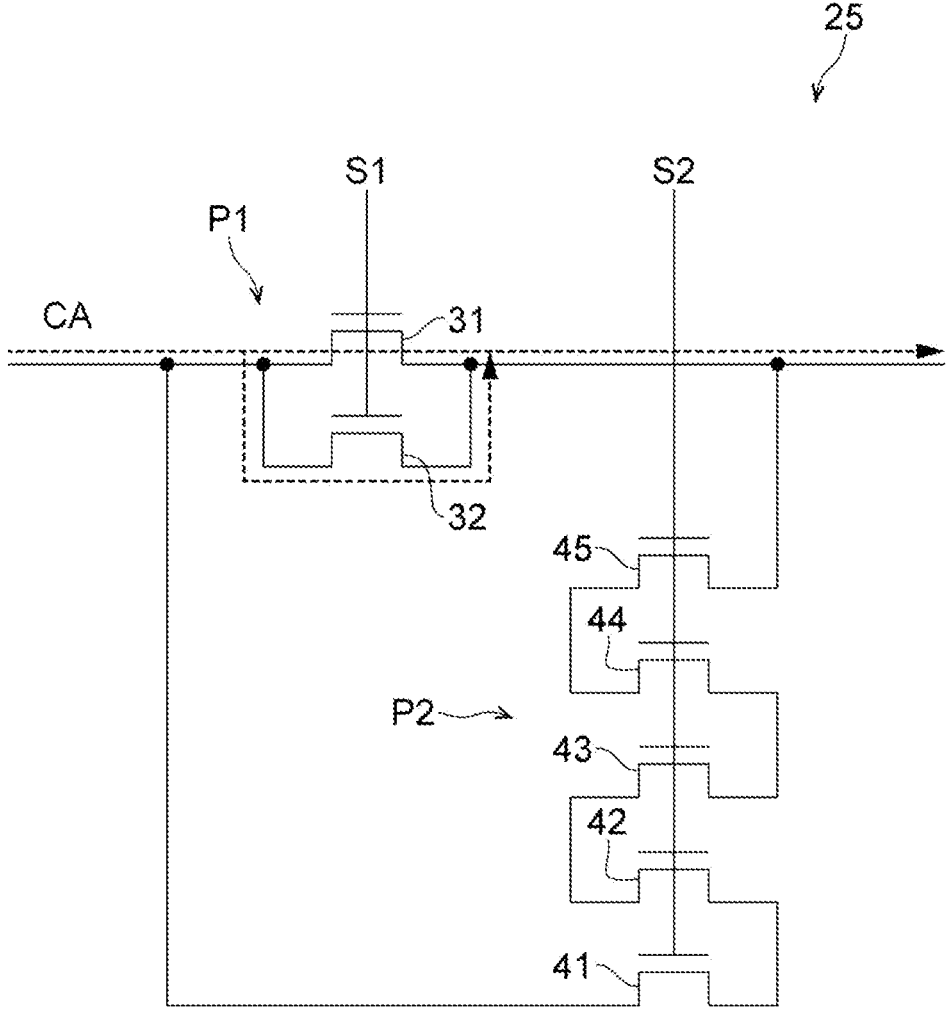

When a high-speed operation mode is selected, the control logic circuit 21 activates both the control signals S1 and S2. With this process, as shown in FIG. 5A, both the signal paths P1 and P2 are in a connected state. Meanwhile, when a low-speed operation mode is selected, the control logic circuit 21 activates the control signal S2 and deactivates the control signal S1. With this process, as shown in FIG. 5B, the signal path P2 is in a connected state and the signal path P1 is in a disconnected state, so that as compared to the case shown in FIG. 5A, the resistance value of the passgate circuit 25 is increased. When the resistance value of the passgate circuit 25 is increased, the circuit constant of an RC circuit formed of the resistance value and parasitic capacitance component of the passgate circuit 25 is changed, so that a high-frequency component included in the command/address signal CA when it passes through the passgate circuit 25 is attenuated. That is, when the signal path P1 is disconnected, the passgate circuit 25 functions as a low-pass filter. Accordingly, even when the ODT circuit 24 is deactivated in a low-speed operation mode, the passgate circuit 25 functions as a low-pass filter, and thus unnecessary ring-back components are eliminated and data eye reduction is prevented. Further, as shown in FIG. 5C, it is also possible to provide an operation mode in which the control signal S1 is activated and the control signal S2 is deactivated. In this case, as shown in FIG. 5C, the signal path P1 is in a connected state and the signal path P2 is in a disconnected state, so that although the resistance value of the passgate circuit 25 is slightly increased as compared to the operation mode shown in FIG. 5A, the resistance value of the passgate circuit 25 is reduced as compared to the operation mode shown in FIG. 5B.

Figure 6:
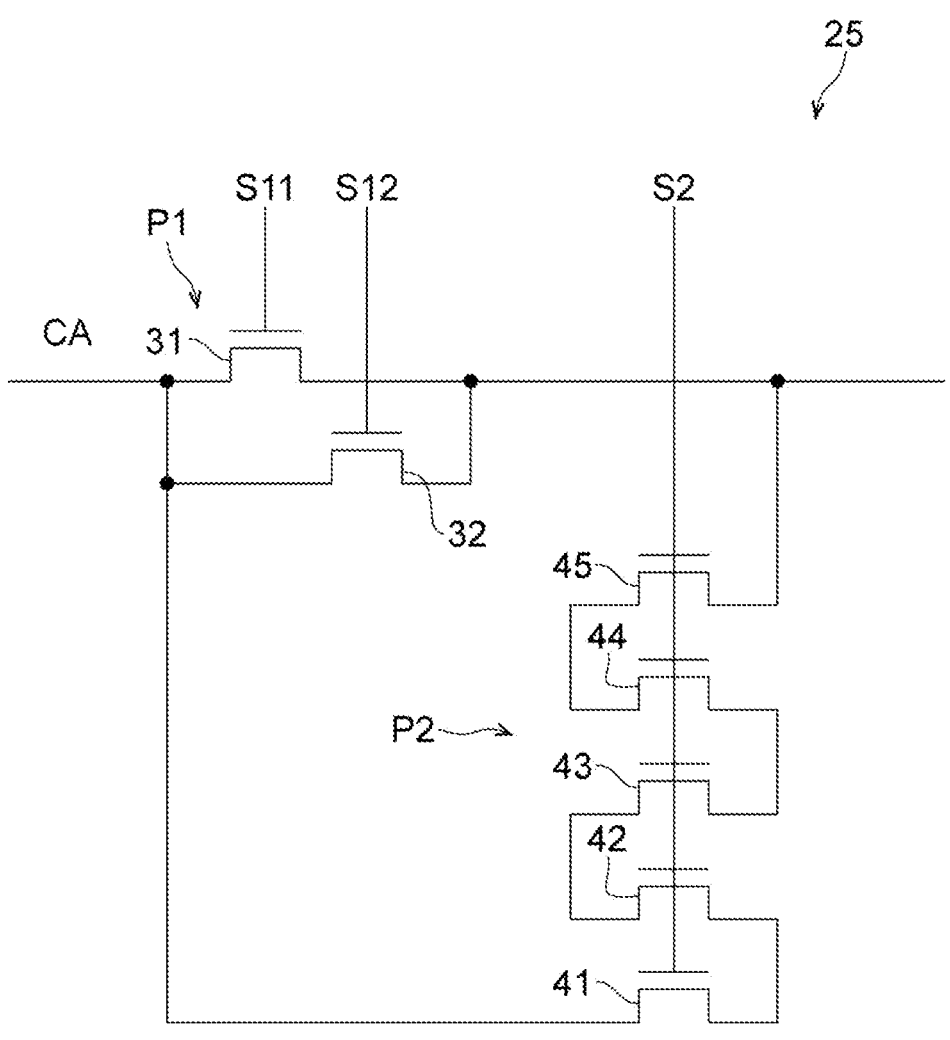
FIGS. 6 to 8 are circuit diagrams of passgate circuits according to modifications.
Figure 7:
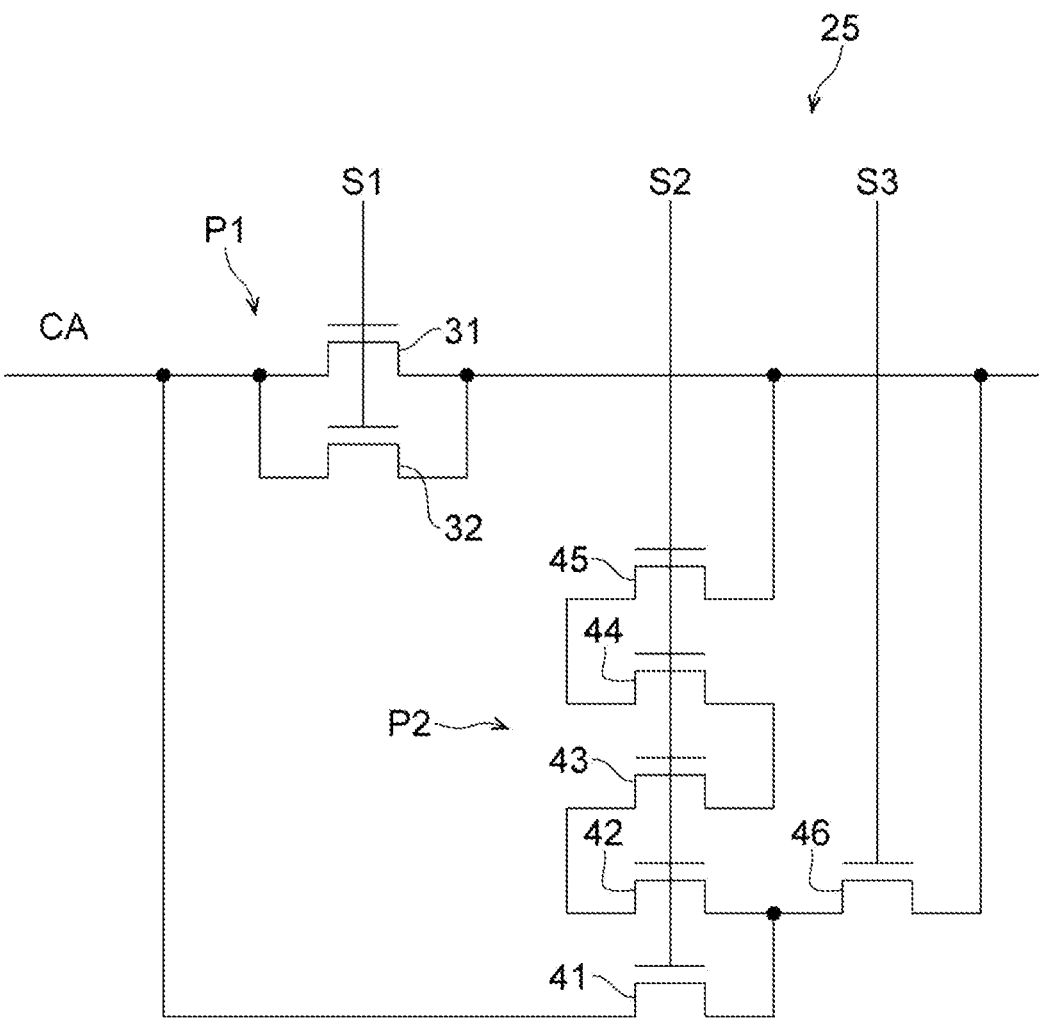
Figure 8:
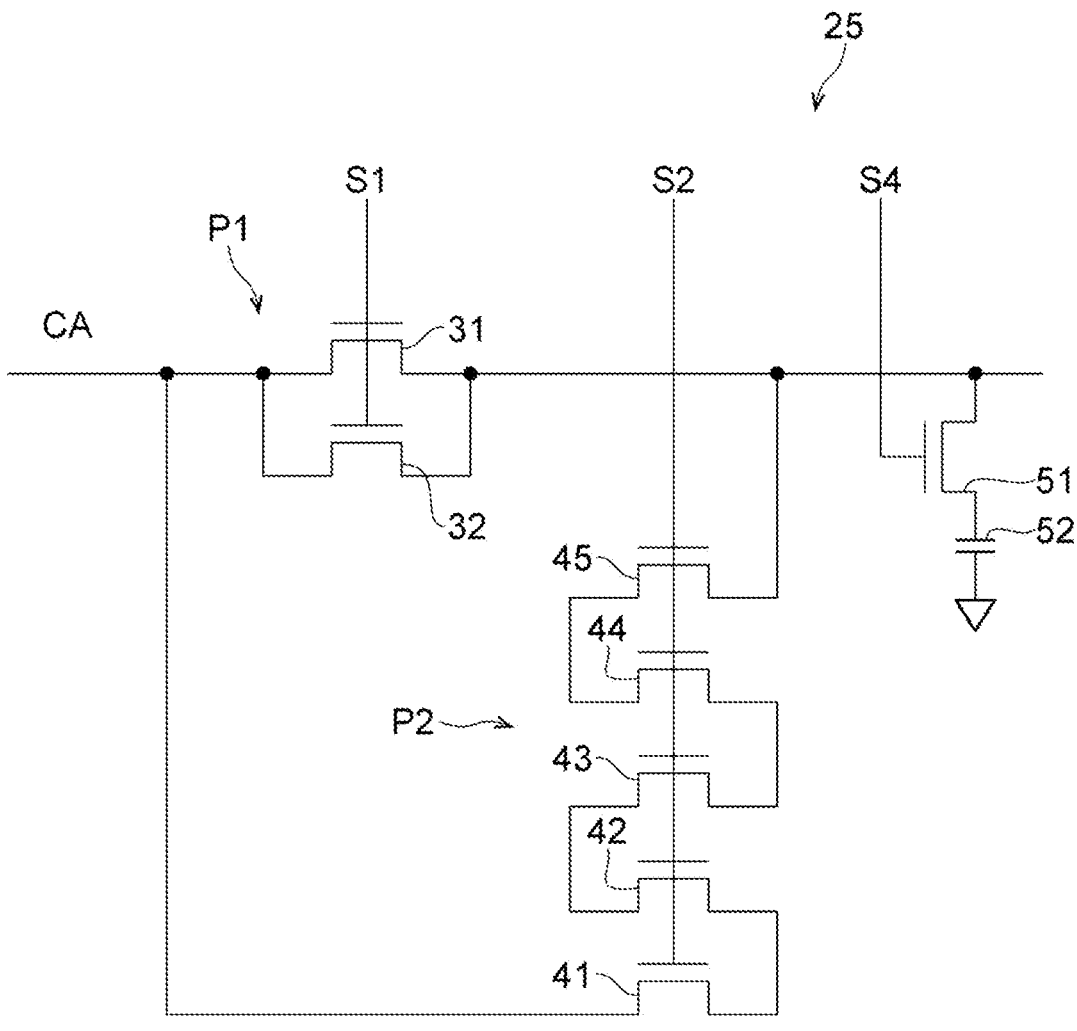

FIG. 6 is a circuit diagram of the passgate circuit 25 according to a first modification. In the example shown in FIG. 6, control signals S11 and S12 are respectively supplied to gate electrodes of the transistors 31 and 32 forming the signal path P1. With this configuration, since turning ON and OFF of the transistors 31 and 32 can be controlled individually, circuit characteristics of the passgate circuit 25 can be controlled more finely. FIG. 7 is a circuit diagram of the passgate circuit 25 according to a second modification. In the example shown in FIG. 7, a transistor 46 is added to the signal path P2. The transistor 46 is connected to the transistors 42 to 45 in parallel, and a control signal S3 is supplied to a gate electrode of the transistor 46. With this configuration, when the control signal S3 is activated, the transistors 42 to 45 are bypassed by the transistor 46. In this manner, the passgate circuit 25 shown in FIG. 7 can control the resistance value of the signal path P2 more finely. FIG. 8 is a circuit diagram of the passgate circuit 25 according to a third modification. In the example shown in FIG. 8, a capacitor 52 and a transistor 51 connected between output nodes of the signal paths P1 and P2 and the capacitor 52 are added in the passgate circuit 25. A control signal S4 is supplied to a gate electrode of the transistor 51. With this configuration, when the control signal S4 is activated, a parasitic capacitance component to be added to the passgate circuit 25 is increased, so that the circuit constant of an RC circuit is changed.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising a passgate circuit between first and second nodes, the passgate circuit having a plurality of transistors at least two of which are operatively connected in parallel in a first mode and operatively connected in series in a second mode, wherein the first node is coupled to a pad electrode supplied with a signal from outside; and an ODT circuit coupled to the pad electrode and deactivated in the second mode.

2. The apparatus of claim 1, wherein the second node is coupled to an input node of an input buffer circuit.

3. The apparatus of claim 1, wherein the plurality of transistors includes first and second transistors coupled in parallel between the first and second nodes and controlled in common by a first control signal activated in the first mode.

4. The apparatus of claim 3, wherein the plurality of transistors further includes third and fourth transistors coupled in series between the first and second nodes and controlled in common by a second control signal activated in the second mode.

5. The apparatus of claim 4, wherein the second control signal is activated in each of the first and second modes.

6. The apparatus of claim 5, wherein the first control signal is deactivated in the second mode.

7. The apparatus of claim 4, wherein the second control signal is deactivated in the first mode.

8. The apparatus of claim 1,
wherein the plurality of transistors includes first and second transistors coupled in parallel between the first and second nodes,
wherein the first transistor is controlled by a first control signal, and
wherein the second transistor is controlled by a second control signal different from the first control signal.

9. The apparatus of claim 1,
wherein the passgate circuit further has a capacitor,
wherein the plurality of transistors includes a first transistor coupled between the first node and the capacitor.

10. An apparatus comprising:
an internal pad electrode;
an input buffer circuit;
an ODT circuit coupled to the internal pad electrode; and
a passgate circuit including first and second signal paths operatively connected between the internal pad electrode and the input buffer circuit in parallel,
wherein the first and second signal paths are different in resistance value from each other,
wherein the first signal path is electrically connected between the internal pad electrode and the input buffer when a first control signal is activated and is electrically disconnected between the internal pad electrode and the input buffer when the first control signal is deactivated, and
wherein the ODT circuit is deactivated when the first control signal is deactivated.

11. The apparatus of claim 10, wherein the second signal path is electrically connected between the internal pad electrode and the input buffer when a second control signal is activated.

12. The apparatus of claim 10, wherein the first signal path is lower in resistance value than the second signal path.

13. The apparatus of claim 12, wherein the first signal path includes a first plurality of transistors coupled between the internal pad electrode and the input buffer circuit in parallel.

14. The apparatus of claim 13, wherein the second signal path includes a second plurality of transistors coupled between the internal pad electrode and the input buffer circuit in series.

15. The apparatus of claim 10, further comprising an external pad electrode supplied with a command/address signal from outside, wherein the external pad electrode and the internal pad electrode are electrically connected via an iRDL.

16. An apparatus comprising:

a pad electrode;

an input buffer circuit;

an ODT circuit coupled to the pad electrode; and a passgate circuit including a first plurality of transistors coupled in parallel between the pad electrode and the input buffer circuit and a second plurality of transistors coupled in series between the pad electrode and the input buffer circuit, wherein the first plurality of transistors are brought into an ON state in a first mode, and wherein the second plurality of transistors are brought into an ON state and the ODT circuit is deactivated in a second mode.

17. The apparatus of claim 16, wherein the second plurality of transistors are brought into an ON state in each of the first and second modes.

18. An apparatus comprising a passgate circuit between first and second nodes, the passgate circuit having a plurality of transistors at least two of which are operatively connected in parallel in a first mode and operatively connected in series in a second mode, wherein the plurality of transistors includes first and second transistors coupled in parallel between the first and second nodes and controlled in common by a first control signal activated in the first mode, wherein the plurality of transistors further includes third and fourth transistors coupled in series between the first and second nodes and controlled in common by a second control signal activated in the second mode, and wherein the second control signal is deactivated in the first mode.

* * * * *